(12) United States Patent
Park et al.

(10) Patent No.: US 8,778,463 B2
(45) Date of Patent: Jul. 15, 2014

(54) METHOD FOR MANUFACTURING THE COLOR CONTROLLED SAPPHIRE

(76) Inventors: Jae-Won Park, Daejeon (KR);
Ju-Hyung Ahn, Euiwang (KR);
Young-chool Kim, Goyang (KR);
Jang-Min Han, Daejeon (KR); Junyeon Kim, Daejeon (KR)

( * ) Notice: Subject to any disclaimer, the term of this patent is extended or adjusted under 35 U.S.C. 154(b) by 622 days.

(21) Appl. No.: 12/996,755

(22) PCT Filed: Jun. 12, 2008

(86) PCT No.: PCT/KR2008/003268
§ 371 (c)(1),
(2), (4) Date: May 6, 2011

(87) PCT Pub. No.: WO2009/151160
PCT Pub. Date: Dec. 17, 2009

(65) Prior Publication Data
US 2011/0200760 A1    Aug. 18, 2011

(51) Int. Cl.
*C23C 14/48*    (2006.01)
*C23C 14/28*    (2006.01)
*C23C 14/30*    (2006.01)
*C23C 14/34*    (2006.01)

(52) U.S. Cl.
USPC ....... 427/529; 427/531; 427/466; 204/192.26

(58) Field of Classification Search
None
See application file for complete search history.

(56) References Cited

U.S. PATENT DOCUMENTS

| 4,849,299 A * | 7/1989 | Loth | 428/542.2 |
| 5,385,762 A * | 1/1995 | Prins | 427/526 |
| 5,885,665 A * | 3/1999 | Gea et al. | 427/529 |
| 5,994,208 A * | 11/1999 | Prins | 438/527 |
| 7,604,846 B2 * | 10/2009 | Park et al. | 427/523 |
| 2005/0196547 A1 * | 9/2005 | Park et al. | 427/532 |

FOREIGN PATENT DOCUMENTS

| JP | 55-162243 A | * 12/1980 | 438/17 |
| JP | 62-087492 | 4/1987 | |
| JP | 63-25602 A | * 2/1988 | H01L 27/14 |
| KR | 10-2006-0065399 | 6/2006 | |
| KR | 10-0856109 | 8/2008 | |

OTHER PUBLICATIONS

Saito, Y. et al., "Coloration of Sapphire by Metal-Ion Implantation." Japanese Journal of Applied Physics, Part 2 (Letters). Nov. 1985, vol. 24, No. 11, pp. L880-L882.

(Continued)

*Primary Examiner* — Marianne L Padgett
(74) *Attorney, Agent, or Firm* — Workman Nydegger (57) ABSTRACT

Disclosed herein is a method of manufacturing a color-controlled sapphire, comprising: vaporizing a metal material, irradiating the vaporized metal material with electron beams or high-frequency waves to form the vaporized metal material into a plasma state, and then implanting the metal ions into a sapphire by extracting the metal ions from the plasma and accelerating the metal ions (step 1); and heat-treating the sapphire implanted with the metal plasma ions in an oxygen atmosphere or in air (step 2). According to the method of manufacturing a sapphire of the present invention, a sapphire, which can exhibit various colors, can be manufactured by implanting the ions, which can cause optical band gap changes into the sapphire, and a sapphire, which cannot be damaged by radiation and can exhibit colors uniformly, can be manufactured by conducting heat treatment under an oxygen atmosphere. Further, according to the present invention, a sapphire, which cannot be damaged by radiation and can be made to exhibit uniform colors, can be manufactured by performing the above processes repeatedly.

2 Claims, 7 Drawing Sheets

(56) References Cited

OTHER PUBLICATIONS

Saito, Y. et al., Coloration of Sapphire by Co Ion Implantation. Nuclear Instrutments & Methods in Physics Research, Section B. 1991, vol. B59-B60, pp. 1173-1176.

Marques et al., "Optical Changes Induced by High Fluence Implantation of Au ion on sapphire", Nuclear Instrutment and Methods in Physics Research B 218 (2004) 139-144.

Alves et al., "Structural and Optical Studies of Co and Ti implanted sapphire", Nuclear Instrutment and Methods in Physics Research B 207 (2003) 55-62.

* cited by examiner

METHOD FOR MANUFACTURING THE
COLOR CONTROLLED SAPPHIRE

TECHNICAL FIELD

The present invention relates to a method of manufacturing color-controlled sapphire, and, more particularly, to a method of manufacturing color-controlled sapphire using ion implantation and heat treatment.

BACKGROUND ART

Sapphire is a single-crystalline aluminum oxide transparent to the visible light. Natural sapphire may include various impurities according to the environment, and thus the energy band gap of the single-crystalline aluminum oxide is influenced by the impurities. For this reason, sapphire may have peculiar colors, such as blue, green, red, yellow, etc., depending on the species of the impurities, and can be used as gemstones. Generally, the colored sapphire is produced in nature in large quantities. Since the amount and kind of the impurities included in sapphire are predetermined, the ability to improve the value of sapphire is limited even when the sapphire is post-treated in order to use the sapphire as a gemstone. Unlike diamond, the colored sapphire has a several times higher value than the transparent sapphire. Therefore, the present invention provides a method—enabling sapphire to exhibit various colors by doping various metallic impurities into the transparent sapphire.

As conventional gemstone coloring methods, a radiation method, a surface diffusion method, and an ion implantation method are used.

First, the radiation method employs a principle in which high-energy particles, such as α-rays or γ-rays, are applied on the surface of a gemstone, so that lattice defects are induced, thereby enabling the jewel to exhibit colors. That is, when sapphire is irradiated with radioactive rays, lattice defects are induced, and the lattice defects act as color centers. From this principle, sapphire can exhibit various colors according to the kind of the radiation and the intensity of the radiant energy. However, the radiation method, in which lattice defects are induced temporarily, is problematic in that, since sapphire is stabilized in combination with oxygen, even when the sapphire is left in the atmosphere for a certain period or is heated slightly, the sapphire is combined with oxygen, so that lattice defects disappear, with the result that the color of the sapphire returns to its original color. Further, this radiation method is problematic in that the radioactive rays applied to sapphire are continuously emitted from the sapphire, and it takes 10 years or more to make the sapphire, which is contaminated with radio-active radiations.

Meanwhile, the surface diffusion method is a method of diffusing impurities into the sapphire by coating the materials on the surface of the sapphire and then heat-treating. Compared to the above the radiation method, this surface diffusion method can solve the problem in which the color of the sapphire returns to its original color and the problem in which radioactive rays are emitted from the sapphire, but is problematic in that a long period and high-temperature treatment conditions are required in order for the impurities to diffuse deeper into the sapphire, and thus the production cost of the sapphire is relatively high.

Further, the ion implantation method is a method of implanting ions into a sapphire by accelerating the ionized elements in a vacuum and is advantageous in that its energy band gap is changed after a post-implantation annealing depending on the kind of ion, and thus various colors are exhibited. However, the ion implantation method is problematic in that the kinds of ions and the chemical reactivity must be considered. Further, this ion implantation method is problematic in that, when the ion energy is excessively high at the time of implanting ions into a sapphire, the surface of the sapphire is damaged by radiation, and when energy is excessively weak, ion implantation occurs only on the surface of the sapphire, so that the sapphire using this ion implantation method is not different from the sapphire using the above surface diffusion method.

Meanwhile, the coloring effects of sapphire due to the addition of elements are different from those of other gemstones. For example, since diamond is composed of carbon, when nitrogen or boron is added to the diamond, the diamond exhibits yellow and blue colors. In contrast, sapphire does not exhibit peculiar colors even when nitrogen or boron, which are non-metallic elements, are added thereto, but can exhibit peculiar colors when metallic elements are added thereto. The reason for this is that the energy band gap (about 9.0 eV) of sapphire is far larger than that (about 5.5 eV) of diamond.

However, not all metallic elements addition exhibits valuable colors by the sapphire when doped by a post-implantation annealing. For example, it was reported in the paper "Nuclear Instrument and Methods in Physics Research b 59 (1991)1173-1176", written by C. Marques, et al., that when gold (Au) is added to sapphire, the sapphire exhibits a dark black color. However, when heat treatment is conducted, sapphire and gold are not reactive with each other and thus cannot be bonded with aluminum and oxygen, and are thus isolated from the bulk sapphire, resulting in no color change. Therefore, the reason why the sapphire exhibits a dark black color is that the sapphire is only damaged by the energy irradiated in the sapphire.

Meanwhile, it was reported in the paper "Nuclear Instrument and Methods in Physics Research b 218 (2004)139-144", written by C. Saito, et al., that cobalt ions are added to sapphire, and then the sapphire is heat-treated at 800° C. and 1000° C., thus obtaining sapphire exhibiting a green color or a light blue color. Here, since the ion energy used is 20 keV, which is low, the depth of the ions implantation into the sapphire is very shallow. However, due to the heat treatment, the ions implantation into the sapphire only to a very shallow depth, exhibiting the sapphire a green color or a light blue color.

Further, Alves, et al. reported in the paper "Nuclear Instrument and Methods in Physics Research b 207 (2003) 55-62" the phenomena occurring in heat treatment after the addition of titanium and cobalt ions to sapphire. As a result, aluminum in sapphire is substituted with titanium and cobalt, and the sapphire remains stable up to a temperature of 1000° C. They also reported that, when heat treatment is conducted under a reducing atmosphere or when a large amount of ions is added to sapphire, the added Ti or Co ions are bonded with each other, and thus they exist in a metallic state. Therefore, the amount of ions added to the sapphire and the heat treatment atmosphere are important factors in the ion implantation method for the sapphire coloration.

Therefore, the present inventors have conducted research in order to manufacture sapphire which is not damaged by radiation and in which colors are uniformly distributed. As a result, they have found that when sapphire is irradiated with a predetermined amount of metal ions having a predetermined energy level, the metal ions are implanted into the sapphire, and when the sapphire is heated in an oxidizing atmosphere, the radiation damage caused by the ion implantation is removed, and simultaneously the metal ions are uniformly diffused into the sapphire. Based on these findings, the present invention was completed.

DISCLOSURE

Technical Problem

Accordingly, the present invention has been made keeping in mind the above problems occurring in the prior art, and an object of the present invention is to provide a method of manufacturing a sapphire having a high commercial value, by which the damage to the surface of the sapphire is minimized, and by which the sapphire can uniformly exhibit various colors.

Technical Solution

In order to accomplish the above object, the present invention provides a method of manufacturing a color-controlled sapphire, comprising: vaporizing a metal material, irradiating the vaporized metal material with electron beams or high-frequency waves to form the vaporized metal material into the plasma, and then implanting the metal ions into a sapphire by extracting and accelerating the metal ions from the plasma (step 1); and heat-treating the sapphire implanted with the metal plasma ions in an oxygen atmosphere or in air (step 2).

Advantageous Effects

According to the method of manufacturing a sapphire of the present invention, a sapphire, which can exhibit various colors, can be manufactured by implanting the ions and a sapphire, which does not contain the damages by radiation and can exhibit colors uniformly, can be manufactured by conducting a heat treatment under an oxidizing atmosphere. Further, according to the present invention, a sapphire with no damage and exhibiting uniform color can be manufactured by performing the above processes repeatedly.

BEST MODE

Hereinafter, the present invention will be described in detail.

In the method of manufacturing a color-controlled sapphire of the present invention, specific metal ions are bonded on the lattice points of aluminum in a sapphire, therefore an optical band structure is changed causing the color change. That is, the method of manufacturing a color-controlled sapphire of the present invention is performed using this principle.

The present invention provides a method of manufacturing a color-controlled sapphire in two steps (steps 1 and 2).

First, in the step 1, metal ions are implanted into a sapphire. Specifically, a metallic material is vaporized through sputtering or heating, the vaporized metal material is irradiated with electron beams or high-frequency waves to change to a plasma state, and the ions in the plasma are implanted into a sapphire by extracting and accelerating the metallic ions.

The metal ions can cause an optical energy band gap change in sapphire, and then the color is changed in sapphire by substituting the metal ions with aluminum atoms in the sapphire. The metallic materials are selected from the group consisting of iron, cobalt, nickel, chromium, scandium, titanium, vanadium, manganese, copper, zinc, yttrium, zirconium, niobium, molybdenum, tellurium, ruthenium, rhodium, palladium and cadmium, and preferably iron, cobalt, and chromium. In the step 1, ion implantation energy is 50 keV~1000 keV. When the ion implantation energy is below 50 keV, there is a problem in that even if color exhibition occurs, implanted ions are concentrated only on the surface of the sapphire, and thus heat treatment must be conducted for a longer time in order for the ions to deeply diffuse into the sapphire. In contrast, when the ion implantation energy is above 1000 keV, there is a problem in that the sapphire is seriously damaged by radiation.

In the range of the ion implantation energy, in order to manufacture a color-controlled sapphire, the metal ions are implanted into the sapphire in an amount of $5 \times 10^{17}$ ions/cm$^2$ or less at one time, and then the sapphire implanted with the metal ions is heat-treated. The implantation of metal ions and the heat treatment are repeatedly conducted 1~10 times until the target concentration of the metal ions is obtained. Preferably, the metal ions may be implanted into the sapphire in an amount of $1 \times 10^{15}$~$5 \times 10^{17}$ ions/cm$^2$ at one time. When the amount of implanted metal ions is above $5 \times 10^{17}$ ions/cm$^2$ at one time, there are problems in that the sapphire is extremely non-crystallized, and thus the damaged sapphire cannot be easily repaired by a heat treatment, and in that a segregation phenomenon occurs between the implanted metals and thus a desirable color emission can not be obtained.

Next, in the step 2, the sapphire implanted with the metal ions is heat-treated in an oxygen rich atmosphere or in air, thus manufacturing a color-controlled sapphire.

The heat treatment serves to decrease the lattice defects in the sapphire, caused by the implantation of the metal ions, and to deeply diffuse the metal ions into the sapphire. In the step 2, the heat treatment may be conducted by increasing the heat treatment temperature within a predetermined temperature range and thus decreasing the heat treatment time, or by decreasing the heat treatment temperature and thus increasing the heat treatment time. Preferably, the heat treatment may be conducted at a temperature of 900-1400° C. in an oxygen rich atmosphere or in air. If the heat treatment is conducted in a reducing atmosphere in which oxygen is deficient, there is a problem in that the segregation of the implanted metallic ions occurs resulting in undesirable turbid color emission. Further, when the heat treatment is conducted at a temperature lower than 900° C., there are problems in that it takes a lot of time to repair the radiation damage to the sapphire, and in that the sapphire may exhibit turbid colors, rather than clear colors. In contrast, when the heat treatment is conducted at a temperature higher than 1400° C., there is a problem in that the sapphire may be cracked.

In relation to this, when the heat treatment is conducted at a temperature higher than 500° C., the sapphire is heated and cooled at a heating or cooling rate of 1° C./min~3° C./min.

The heat treatment is conducted for 2~36 hours. When the heat treatment is conducted for less than 2 hours, there is a problem in that color exhibition is incomplete. In contrast, when the heat treatment is conducted for more than 36 hours, there is a problem in that the color may be diluted due to too much diffusion.

Next, in the step 3, the implantation of metal ions in the step 1 and the heat treatment in the step 2 are repeatedly conducted until the target concentration of the metal ions is obtained.

According to the present invention, in the steps 1 and 2, the concentration of metal ions is gradually increased, so that radiation damage to the surface layer of the sapphire is minimized, and simultaneously the metal ions are uniformly implanted into the sapphire. Subsequently, in the step 3, in order to repair the radiation damage caused by the implantation of the metal ions, steps 1 and 2 may be repeatedly conducted several times.

[Mode for Invention]

Hereinafter, the present invention will be described in more detail with reference to the following Examples.

Here, the following examples are set forth to illustrate, but the scope and features of the present invention are not limited thereto.

EXAMPLE 1

Manufacture of Color-Controlled Sapphire

Step 1

First, a colorless sapphire was placed on an ion irradiation jig in a vacuum chamber of an ion implanter, and then iron was vaporized through sputtering or heating. Thereafter, the vaporized iron was irradiated with electron beams or high-frequency waves to form plasma. Subsequently, iron ions were separated from the plasma using a negative voltage of 20-50 kV, and then the separated iron ions were accelerated using a negative voltage of ≥50 kV, thereby implanting the iron ions into the sapphire in an amount of $1 \times 10^{17}$ ions/cm$^2$ using the total ion implantation energy of about 100 keV.

Step 2

The sapphire implanted with iron ions, obtained in the step 1, was heated to a temperature of 900° C. at a heating rate of 3° C./min for 6 hours. Thereafter, the heated sapphire was cooled at a cooling rate of 3° C./min. Steps 1 and 2 were repeatedly conducted several times, thus increasing the concentration of colors.

EXAMPLE 2

Manufacture of Color-Controlled Sapphire

Example 2 was performed using the same method as in Example 1, except that chromium ions were used instead of iron ions. Here, steps 1 and 2 were conducted one time.

EXAMPLE 3

Manufacture of Color-Controlled Sapphire

Example 3 was performed using the same method as in Example 1, except that cobalt ions were used instead of iron ions. Here, steps 1 and 2 were conducted one time.

Analysis

1. Observation with the Naked Eye

TABLE 1

|  | Implanted ion | Color |
|---|---|---|
| Example 1 | iron | Yellow |
| Example 2 | chromium | light yellow |
| Example 3 | cobalt | sky-blue |

Figure 1:
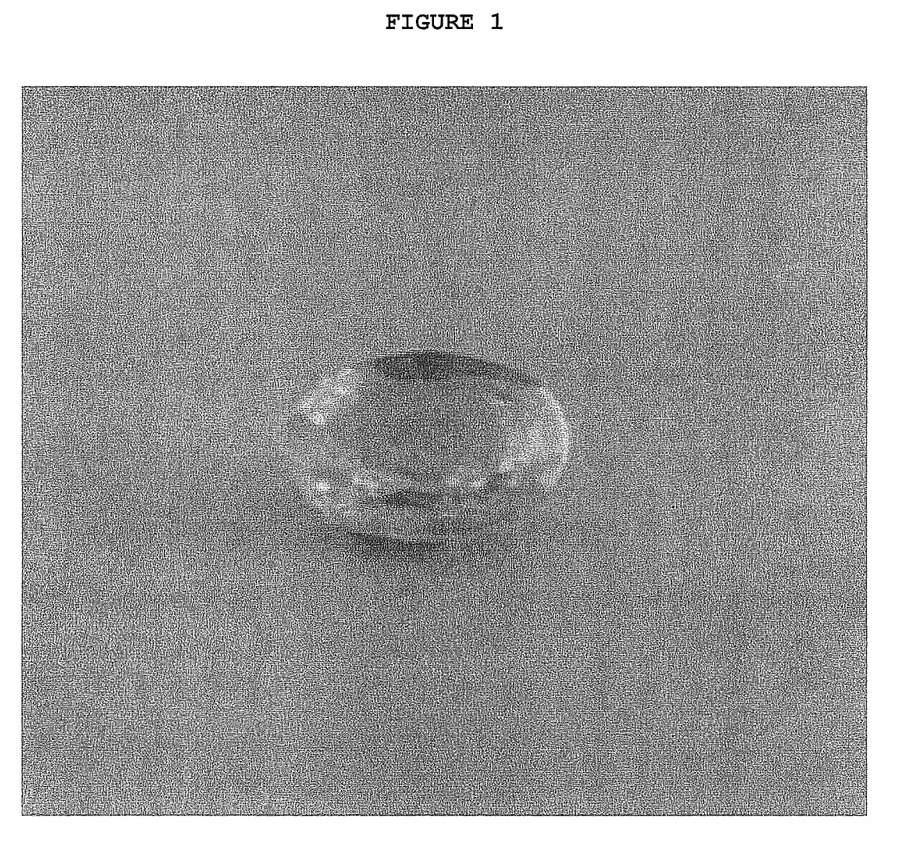
FIG. 1 is a photograph showing a color-controlled sapphire implanted with iron ions followed by a heat treating in an oxidizing atmosphere according to the present invention.
Figure 2:
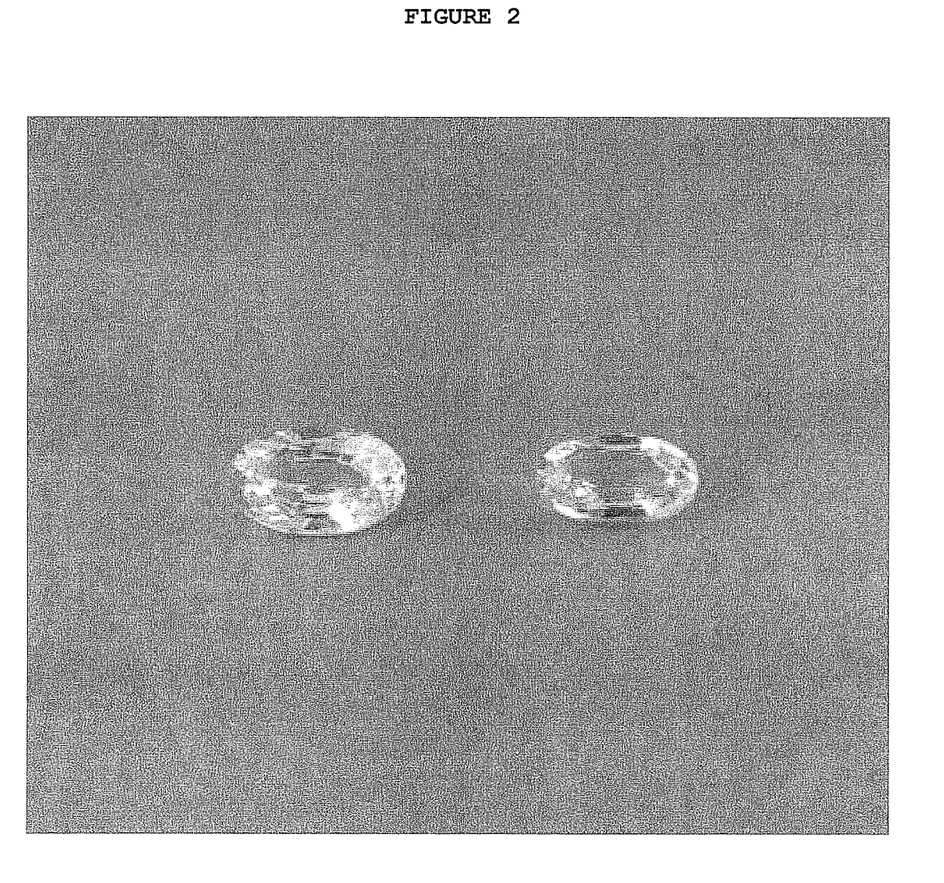
FIG. 2 is a photograph showing a color-controlled sapphire implanted with chromium ions followed by a heat treating in an oxidizing atmosphere according to the present invention.
Figure 3:
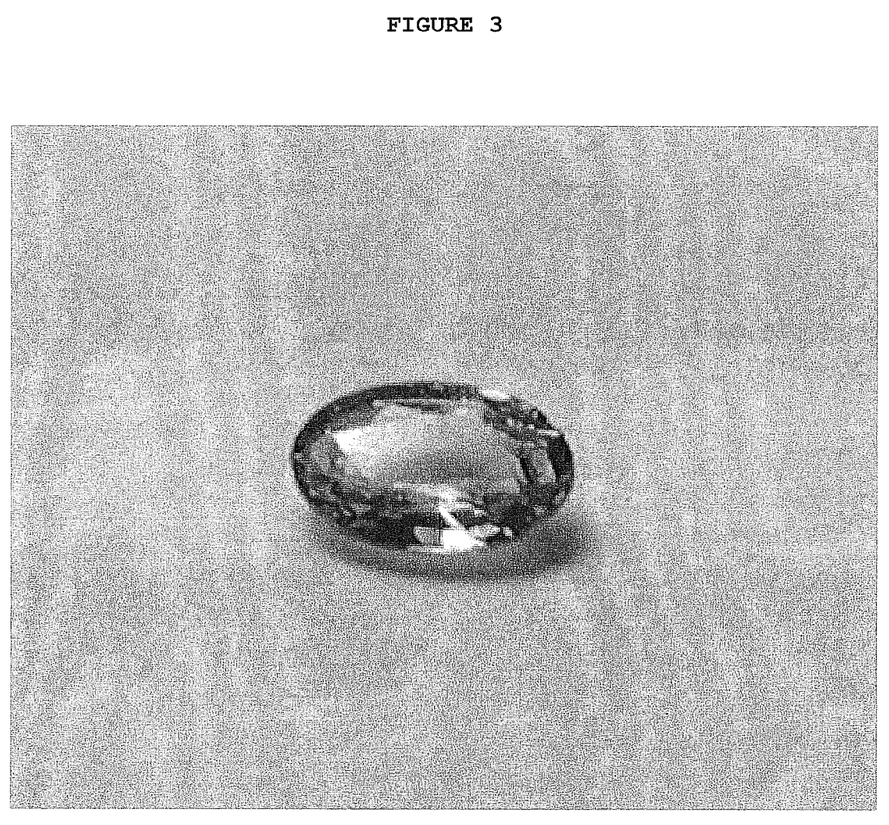
FIG. 3 is a photograph showing a color-controlled sapphire implanted with cobalt ions followed by a heat treating in an oxidizing atmosphere according to the present invention.

The results of the observation with the naked eye of the color-controlled sapphires manufactured in Examples 1 to 3 are shown in Table 1 and in respective FIGS. 1 to 3. From FIGS. 1 and 2, it can be seen that, compared to the sapphire implanted with no metal ions (right of FIG. 2), the sapphire implanted with iron ions (FIG. 1) and the sapphire implanted with chromium ions (left of FIG. 2) are all yellow, but are different from each other in color concentration. Therefore, from these results, it can be seen that sapphires exhibiting various colors according to the kind of metal ions can be manufactured. Further, the sapphire implanted with cobalt ions (FIG. 3) was blue, but its color became lighter as the heat treatment temperature and heat treatment time were increased. The cobalt ions were deeply diffused into the sapphire, and thus a color-controlled sapphire was manufactured.

2. X-Ray Photoelectric Spectrophotometer Analysis

In order to verify the mechanism by which the color of the sapphire was changed by cobalt ion implantation and heat treatment, a Co2p peak of the implanted cobalt was analyzed using an X-ray photoelectron spectroscopy XPS (AXIS-NOVA, Kratos). Here, Co2p peak was obtained by irradiating test samples with X-rays and then measuring the photoelectrons, and thus the binding state of electrons in the cobalt atom was verified. From the analysis of the Co2p photoelectrons of the implanted cobalt, it can be seen that, when the bonding state of aluminum and oxygen, which are constituent elements of the sapphire, is verified through the analysis, the implanted cobalt is chemically bonded with the sapphire, so that the sapphire is stabilized, thus manufacturing a color-controlled sapphire.

Figure 4:
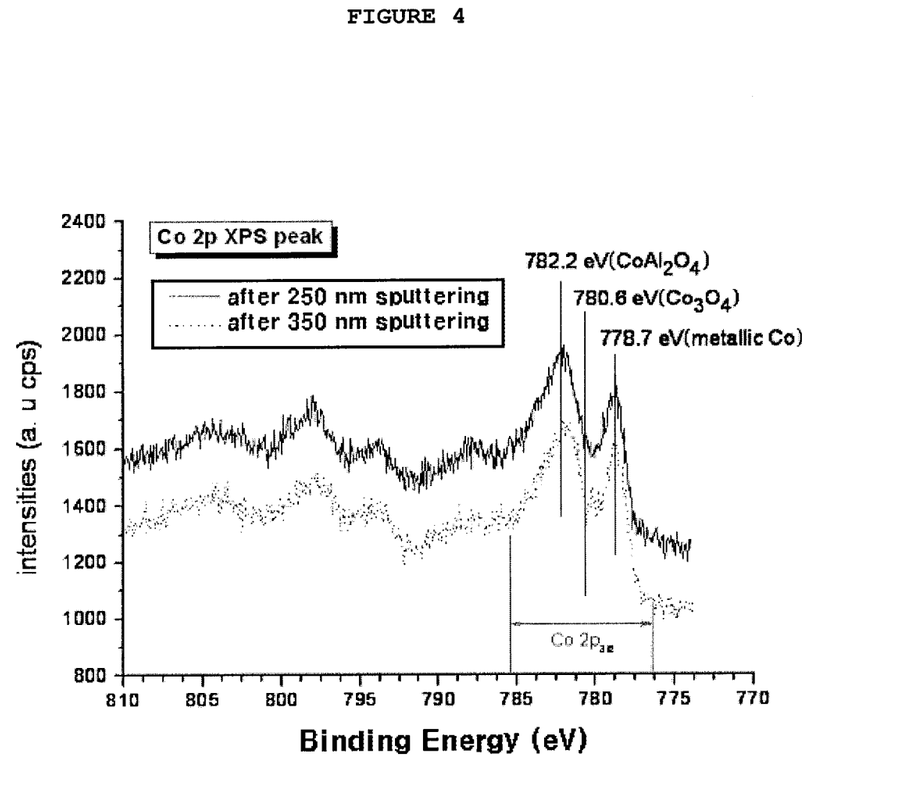
FIG. 4 is a graph showing a spectrum of a Co2p bond in the color-controlled sapphire implanted with cobalt ions, obtained using an X-ray photoelectron spectroscopy (XPS), according to step 1 of the present invention.
Figure 5:
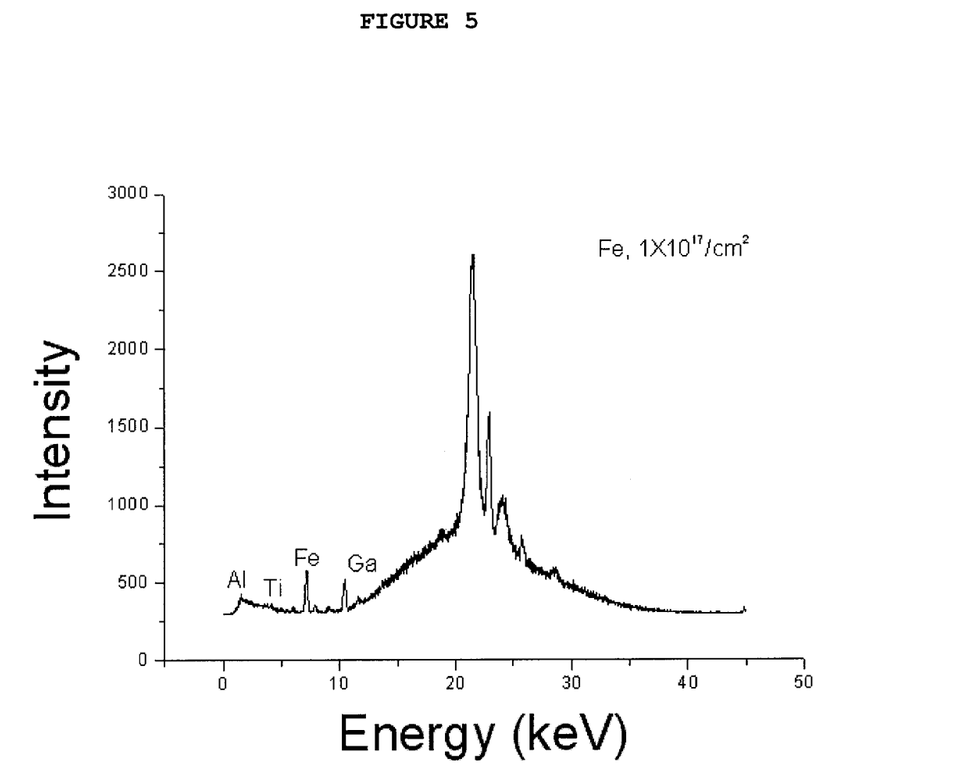
FIG. 5 is a graph showing a spectrum of a Co2p bond in the color-controlled sapphire implanted with cobalt ions followed by a heat treating in an oxidizing atmosphere, obtained using an XPS, according to the present invention.

The results of analysis of the sapphire manufactured in Example 3 using the X-ray photoelectric spectrophotometer are shown in FIGS. 4 and 5.

FIG. 4 shows a spectrum showing the chemical-bonding state of cobalt present in the sapphire manufactured in step 1 of Example 3. In FIG. 4, a peak of 778.7 eV designates metallic cobalt, a peak of 783.6 eV designates $CoAl_2O_4$, and a peak of 780.6 eV designates $Co_3O_4$. From FIG. 4, it can be seen that, since a peak of 778.7 eV appears in the sapphire which is not heat-treated, metallic cobalt is present in the sapphire, but it can be seen that, since peaks of 783.6 eV and 780.6 eV appear in this sapphire, cobalt is chemically bonded with aluminum and oxygen in the sapphire. That is, these facts mean that the energy of the implanted metal ions acts as a driving force only by the implantation of metal ions, thus forming compounds. However, Co, Al and O atoms in the sapphire manufactured in this way have very low bonding stability, and the sapphire exhibits a black color due to the radiation damage to the sapphire.

FIG. 5 shows a spectrum showing the chemical-bonding state of cobalt present in the sapphire manufactured in steps 1 to 3 of Example 3. From FIG. 5, it can be seen that a peak of 778.7 eV, designating metallic cobalt, became weak, and a peak of 782.2 eV, designating a compound composed of cobalt, aluminum and oxygen, became strong. These facts mean that most of the metallic cobalt is stably bonded with aluminum and oxygen, constituting the sapphire, using heat as a driving force, so that the optical energy band of the sapphire is changed, thereby manufacturing a sapphire exhibiting a blue color.

3. Energy Dispersive X-Ray Fluorescence Analysis

In order to find out the main coloring source of the color-controlled sapphire, energy dispersive X-ray fluorescence analysis was conducted. An energy dispersive X-ray fluorescence analyzer, which is used in the quantitative and qualitative analysis of elements present in materials, can find out the main coloring source depending on the kind and strength of elements.

Figure 6:
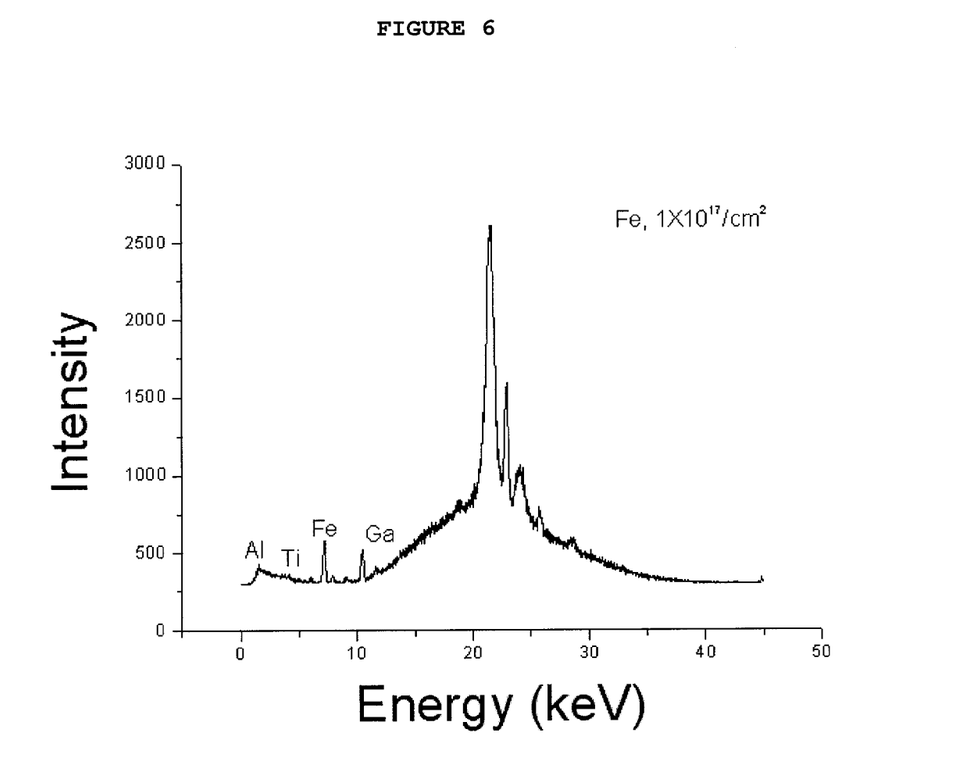
FIG. 6 is a graph showing a spectrum of elements in the color-controlled sapphire implanted with iron ions, obtained using an energy dispersive X-ray fluorescence spectroscopy, according to the present invention.

The results of the energy dispersive X-ray fluorescence analysis of the sapphire manufactured in Example 1 were shown in FIG. 6. As shown in FIG. 6, it can be seen that the peak of iron ions was stronger than that of other metal ions. This fact means that iron ions are present in the sapphire. In contrast, from FIG. 6, it can be seen that peaks of gallium and chromium also appeared. This fact means that gallium and chromium were present in the sapphire even before the iron ions were implanted into the sapphire. That is, although impurities were present in the sapphire, the concentration thereof was insufficient, so that the energy band gap of the sapphire was not changed, with the result that the colors of the sapphire were not influenced by the impurities. Therefore, it means that the main coloring source of the sapphire is iron ions.

4. UV-Vis Spectrum Analysis

In order to determine the color exhibited by the sapphire by analyzing the wavelength absorbed by the color-controlled sapphire manufactured in Example 3, UV-Vis spectrum analysis was conducted. From the UV-Vis spectrum analysis, the kind of color exhibited by the sapphire implanted with cobalt can be inferred by observing the wavelength absorbed in a visible light region.

Figure 7:
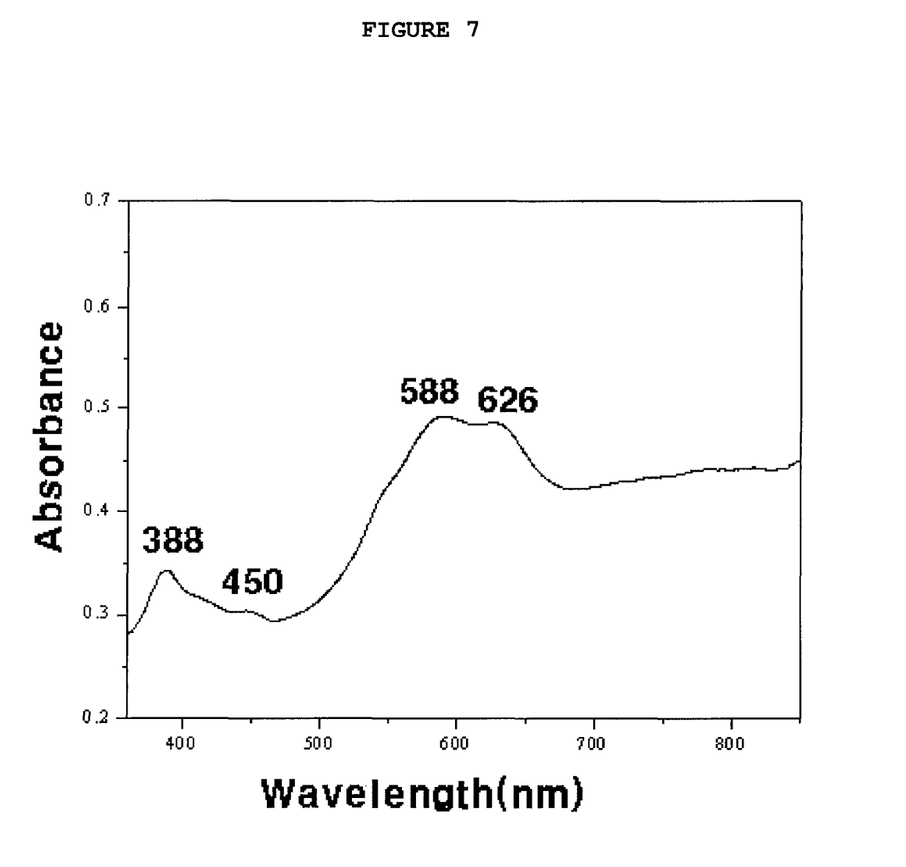
FIG. 7 is a graph showing a UV-visible absorption spectrum of the color-controlled sapphire implanted with cobalt ions followed by a heat treating in an oxidizing atmosphere according to the present invention.

FIG. 7 shows the wavelength region absorbed by the sapphire implanted with cobalt ions by irradiating blue test samples with ultraviolet rays and visible rays after the implantation of cobalt ions and heat treatment. From FIG. 7, it was found that the sapphire manufactured according to the present invention absorbs a wavelength of 388 nm~450 nm and a wavelength of 588 nm~626 nm, but absorbs small amounts of other wavelengths, and thus the sapphire exhibits a blue color.

The invention claimed is:

1. A method of manufacturing a color-controlled sapphire, comprising steps of:
   (1) vaporizing chromium through sputtering or heating;
   (2) irradiating the vaporized chromium with electron beams or high-frequency waves to form the vaporized chromium into a plasma state having chromium ions formed from the vaporized chromium;
   (3) extracting the chromium ions from the plasma;
   (4) accelerating the chromium ions;
   (5) implanting the chromium ions into a sapphire;
   (6) heat-treating the sapphire implanted with the chromium ions at a temperature of 900~1400° C. for 2~36 hours in an oxygen atmosphere or in air; and
   (7) cooling the sapphire,
   wherein, in the step of implanting, energy of the chromium ions to be implanted is 50 keV~1000 keV, and the chromium ions are implanted into the sapphire in an amount of $1\times10^{15}$~$5\times10^{17}$ ions/cm$^2$, and
   wherein a color imparted by implantation of the chromium ions in the sapphire is stable following heat-treating at 900~1400° C. for 2~36 hours.

2. The method of manufacturing a color-controlled sapphire according to claim 1, wherein steps of vaporizing to heat-treating are conducted 1-10 times.

* * * * *